United States Patent
Yang et al.

(10) Patent No.: US 6,921,956 B2
(45) Date of Patent: Jul. 26, 2005

(54) OPTICAL APPARATUS USING VERTICAL LIGHT RECEIVING ELEMENT

(75) Inventors: Seung-Kee Yang, Suwon-shi (KR); Byung-Ok Jeon, Suwon-shi (KR); Hwa-Young Kang, Suwon-shi (KR); Do-Young Rhee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/671,195

(22) Filed: Sep. 25, 2003

(65) Prior Publication Data

US 2004/0188788 A1 Sep. 30, 2004

(30) Foreign Application Priority Data

Mar. 28, 2003 (KR) .................................. 10-2003-0019620

(51) Int. Cl.[7] ........................................ H01L 31/0232
(52) U.S. Cl. ............................ 257/432; 257/81; 257/98
(58) Field of Search ............................. 257/432, 81, 98

(56) References Cited

U.S. PATENT DOCUMENTS 5,218,223 A * 6/1993 Spaeth et al. ............... 257/436
6,246,097 B1 * 6/2001 Kato et al. .................. 257/432
6,257,772 B1 * 7/2001 Nakanishi et al. ............ 385/89

* cited by examiner

Primary Examiner—Jerome Jackson
(74) Attorney, Agent, or Firm—Cha & Reiter, L.L.C.

(57) ABSTRACT

An optical apparatus having a vertical light receiving element is disclosed. The optical apparatus is configured to couple light generated from a light source using the vertical light receiving element, then transforms the received light signals into an electric signal. The optical apparatus includes: a vertical photo detector having a photo-absorption layer; and an optical bench on which the photo detector is disposed. The optical bench having a first groove and a second groove formed adjacent to each other, the first groove having a predetermined inclination and being formed at an edge of a first surface of the optical bench, and the first surface being opposite to a second surface of the optical bench, on which the photo detector is disposed, such that a light signal incident to the first groove is refracted at a predetermined angle by the first groove; and the light signal, which has been refracted by the first groove, is totally reflected by the second groove. As a result, that the light signal is substantially and vertically incident into the photo-absorption layer.

18 Claims, 5 Drawing Sheets

OPTICAL APPARATUS USING VERTICAL LIGHT RECEIVING ELEMENT

CLAIM OF PRIORITY

This application claims priority to an application entitled "Optical apparatus using vertical light receiving element," filed in the Korean Intellectual Property Office on Mar. 28, 2003 and assigned Serial No. 2003-19620, the contents of which are hereby incorporated by reference.

BACKGROUND OF THE INVENTION

1. Field of the Invention

The present invention relates to an optical apparatus, and more particularly to an optical apparatus using a vertical light receiving element for coupling a light signal from a light source and then transforming the received light signal into an electric signal.

2. Description of the Related Art

In order to manufacture a light module of ultra-low cost, the light module must be manufactured in complete automatization, that is, in a chip mounting method. Two-dimensional optical coupling is necessary in optical coupling, such as optical coupling between a laser diode and a photodiode, between a fiber and a photodiode, and between a Planar Lightwave Circuit (PLC) and a photodiode, and so forth.

The optical coupling is needed to enable light signals emitted from light sources, such as a laser diode, fiber, a Planar Lightwave Circuit (PLC) device and the like, to arrive at a light receipt surface without experiencing any loss in the monitoring paths of the light signals, so as to be converted into optimal electric signals.

A Planar Lightwave Circuit (PLC) platform, which is essentially a Printed Circuit Board (PCB) with photo circuits, has been proposed to be used in a photo module for actualizing photoelectric transformation at a higher speed up to several gigabits per second.

FIG. 1 is a view showing a basic structure of a photo PCB forming a PLC platform according to the prior art. As shown, a PLC section 10 comprises a part of a substrate 8—that is, a right part of the substrate 8—and a quartz-based optical waveguide formed on the right part of the substrate 8 in which the quartz-based optical waveguide comprises upper clad layer 1, core layer 2 and lower clad layer 3. The PLC section 10 performs splitting/coupling functions for light signals.

A photo device mounting section 20 is positioned at another part of the substrate 8, that is, at a central part of the substrate 8. A photo device 4, such as a laser, a photodiode and so forth, is mounted on the photo device mounting section 20, and performs signal-transform functions from light signals to electric signals and vice versa. An electric distributing section, which is the rest part of the substrate 8, connects the photo device 4 with a driving circuit and transmits high frequency signals over GHz.

Further, a silicon terrace 7 having a section of terrace shape is installed on the substrate 8 in order to match the height of the photo device 4 to that of the PLC part. Therefore, it is possible to transmit and receive digital signals of several gigabits.

However, in the conventional structure, which employs the three-dimensional optical coupling method using a vertical light receiving element, it is necessary to adjust the vertical position of the photo device—in the case of the single mode, and further position adjusting, assembling, and fixing operations must be performed within the error range of ±1 μm. Therefore, the prior art technique is problematic, in that more working errors may happen during the optical coupling process in comparison with the two-dimensional package having two degrees of freedom.

SUMMARY OF THE INVENTION

Accordingly, the present invention has been made to overcome the above-mentioned problems and provides additional advantages, by providing an optical apparatus having a vertical light receiving element which can two-dimensionally couple a light signal generated from a light source.

One aspect of the present invention is to provide an optical apparatus using a vertical light receiving element that may be realized in a reliable and simple implementation.

In one embodiment, an optical apparatus using a vertical light receiving element includes: a vertical photo detector having a photo-absorption layer; and an optical bench on which the photo detector is disposed, the optical bench having a first groove and a second groove formed adjacent to each other. The first groove comprises a predetermined inclination and formed at the edge of a first surface of the optical bench. The first surface is provided at opposite end to a second surface of the optical bench on which the photo detector is disposed. A light signal incident on the first groove is refracted at a predetermined angle, and the refracted light by the first groove is totally reflected by the second groove, so that the light signal is almost vertically incident into the photo-absorption layer.

It is preferred that the optical bench is made from one of a group VI, a group II-VI, and a group III-V semiconductor materials in which a specific crystalline direction is etched slowly than other directions when it is wet-etched by a wet solution, so that the semiconductor material forms an inclined profile after being etched, and the optical bench generally may be a silicon optical bench.

According to another aspect of the present invention, an optical apparatus using a vertical light receiving element includes: a vertical photo detector having a photo-absorption layer; an optical bench on which the photo detector is mounted, the optical bench having a first groove and a second groove formed adjacent to each other, the first groove having a predetermined inclination and being formed at an edge of a first surface of the optical bench, the first surface being opposite to a second surface of the optical bench, on which the photo detector is mounted; a light source; and, a substrate for mounting the light source and the optical bench on which the photo detector is mounted, wherein: a light signal generated from the light source is refracted by the first groove and then incident to the inside the optical bench, and the light signal, which has been refracted by the first groove, is totally reflected by the second groove so that the light signal is substantially and vertically incident into the photo-absorption layer.

DETAILED DESCRIPTION OF THE PREFERRED EMBODIMENT

Figure 1:
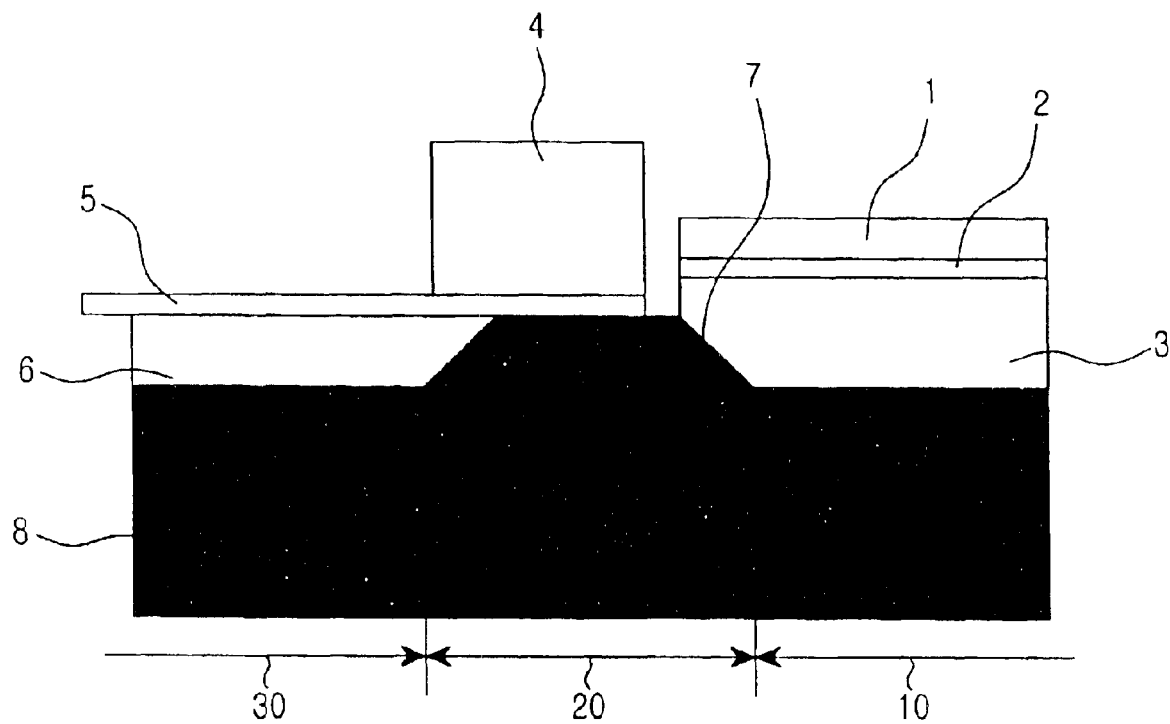
FIG. 1 is a view showing the basic structure of a photo PCB forming a PLC platform according to the prior art.

Hereinafter, an optical apparatus using a vertical light receiving element according to preferred embodiments of the present invention will be described with reference to the accompanying drawings. It is to be noted that the same elements are indicated with the same reference numerals throughout the drawings. For the purposes of clarity and simplicity, a detailed description of known functions and configurations incorporated herein will be omitted as it may make the subject matter of the present invention unclear.

Figure 2:
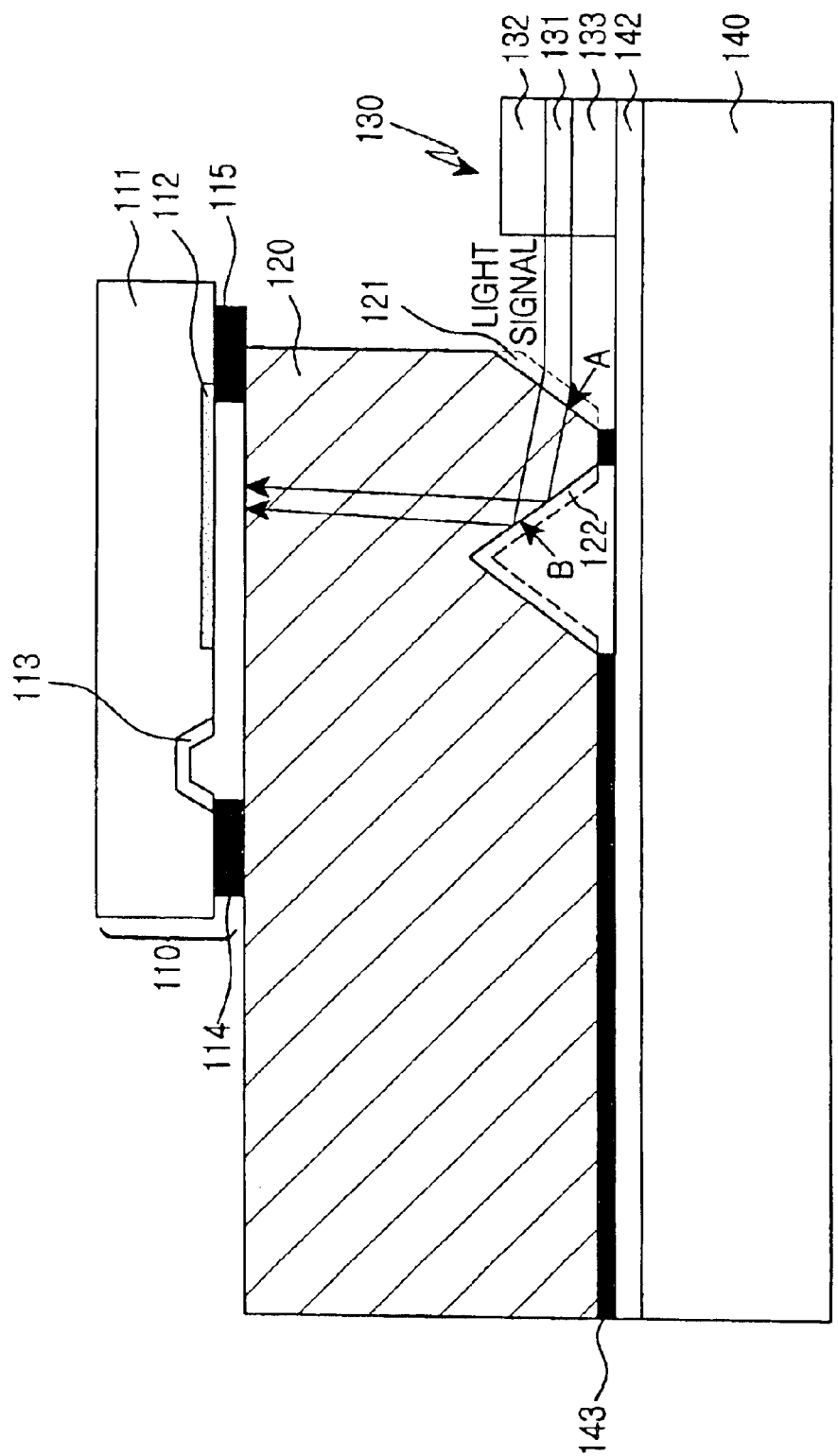
FIG. 2 is a sectional view showing the structure of a light receiving element according to a preferred embodiment of the present invention.

Referring to FIG. 2, a light receiving element according to the embodiment of the present invention includes a vertical photo detector 110 having a photo-absorption layer and an optical bench 120 on which the photo detector 110 is disposed thereon. In the optical bench 120, a first groove A is formed with a predetermined slant angle at the edge of the surface that is opposite to the upper surface on which the photo detector 110 is disposed, and a second groove B is formed next to the first groove A. The light receiving element further includes a light source 130 and a substrate 140 on which the optical bench 120 and the light source 130 are disposed thereon. Reference number 111 represents a semiconductor layer, reference number 113 represents a metal layer, reference number 114 represents an n-type electrode, and reference number 115 represents a p-type electrode.

The photo detector 110, which is a vertical photo detector, may be a top surface illumination-type photodiode or a back illumination-type photodiode. For simplicity and to avoid redundancy, the embodiment according to the present invention will be explained in a case where the top surface illumination-type photodiode is used.

The optical bench 120 performs a light-path-change function so that light signals generated from light sources, such as a laser, a PLC and so forth, are substantially and vertically incident into the photo-absorption layer 112 of photo detector 110. The photo detector 110 is disposed on the upper surface of the optical bench 120. An anti-reflective coating layer 121 is formed on the first groove A so that the light signals from light sources, such as a laser diode, a planar lightwave circuit (PLC), etc., are incident into the inside the optical bench 120 without reflection so as to minimize loss of light signals.

A total reflection layer 122 is formed on the second groove B so that the light signals, which are incident therein without reflection through the anti-reflective coating layer 121, are reflected totally and vertically incident into the photo-absorption layer.

The optical bench 120 consists of a semiconductor material (111) plane that is slowly etched and thus an inclined profile is formed after an etching process. This etching process has been performed with a wet solution so that a specific crystalline direction is etched more slowly than other directions in a crystal structure. The optical bench 120 is made from one of a group VI, a group II-VI and a group III-V semiconductor substrates in a single crystal growth using a chemical vapor deposition process. Note that this embodiment is explained using a silicon. Slant angles of (111) planes formed by such an etching are different according to materials, but most of (111) planes have a slant angle of 55±5° on the basis of horizontal direction.

The anti-reflective coating layer 121 may be formed by depositing anti-reflective materials on the first groove A, which has been formed by etching the edge of a rear surface of the optical bench 120 with an inclination. Note that if the anti-reflective coating layer 121 is not available, about 30 to 35% of incident light signals are reflected according to the wavelengths and the rest of the light signals may go through the incident facet. Therefore, in an alternate embodiment, the anti-reflective coating layer 121 will be adopted selectively in consideration of reflection (that is, a degree of light loss), convenience of manufacturing process, and characteristic of light device. For example, in the case of a Monitor Photo Diode (MPD) is used to perform the monitoring function of the light signals, it is preferred not to form an anti-reflective coating layer 121 for the convenience of manufacturing process.

The total reflection layer 122 reflects all of light signals inputted inside the optical bench 120 through the anti-reflective coating layer 121, and may consist of an air layer or a vapor layer on second groove B. Alternatively, the total reflection layer 122 may be formed by depositing total-reflection materials on the second groove B through a CVD (Chemical Vapor Deposition) process or a PVD (Physical Vapor Deposition) process.

The light source 130 generates and outputs light signals, and may be a laser, a PLC device, fiber or so forth. For simplicity, this embodiment is explained in which the light source is a PLC device 130 comprising a core layer 131, an upper clad layer 132, and a lower clad layer 133.

On the substrate 140, the light source 130 and the optical bench 120 mounting the photo detector 110 are disposed thereon. The substrate 140 may be made from a silicon. Note that silicon is suitable to form optical waveguides requiring a hot process, and can prevent temperature of the device from rising—because the silicon having a high thermal conductivity functions as a heat sink—under the condition which a laser or a semiconductor IC is operated in high power as a light source. Reference number 142 represents a $SiO_2$ layer, and reference number 143 represents a metal layer.

Now, the operation of the optical apparatus having the construction as described above is as follows.

Figure 3:
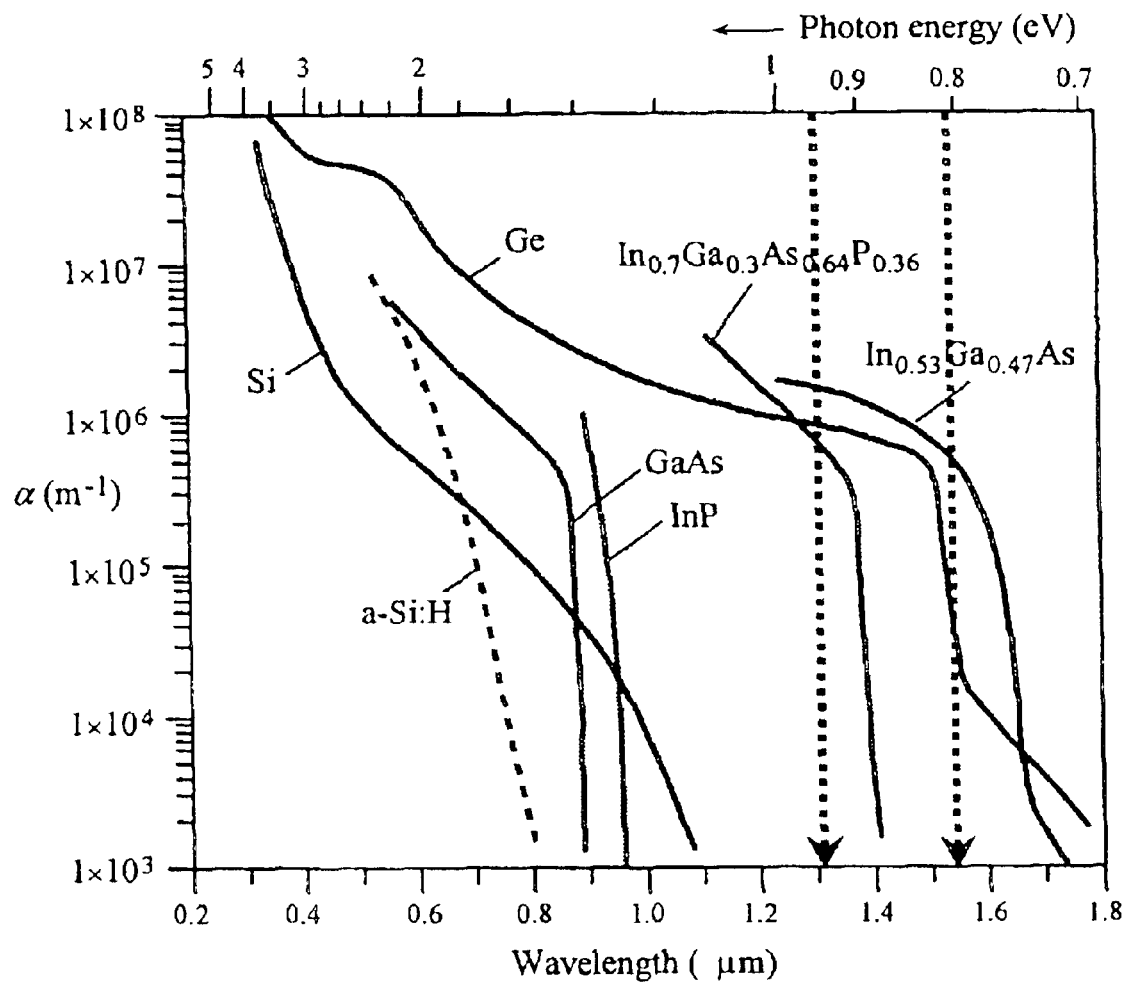
FIG. 3 is a view for explaining absorption coefficients according to wavelengths in several semiconductors.

In operation, light signals are inputted from the PLC 130 and arrive at the first groove surface A, and then progress into the inside optical bench 120 through the anti-reflective coating layer 121, which formed on the first groove surface A. Then, as shown in FIG. 3, light signals having the wavelengths of 1.3 μm (energy bandgap of 1 eV) and 1.55 μm (energy bandgap of 0.8 eV), which are common wavelength used in optical communication, are not absorbed in the optical bench 120 and passes the optical bench 120. The reason for this is that the energy bandgap of the InP is too large at normal temperature to absorb any energy and thus the light signals pass through the optical bench 120. Therefore, incident light progresses through the first groove A at a refracted state without light loss. However, such an incident light is refracted whenever the incident light passes two different media from each other, which may be understood by Snell's law in which the degree of light refraction is defined when the light passes a boundary surface between two media having different properties from each other.

Figure 4:
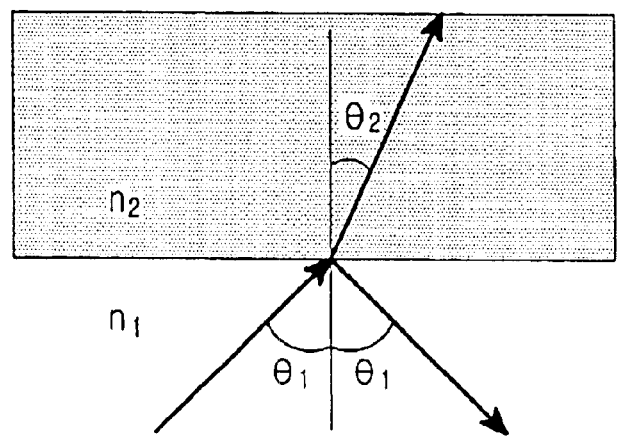
FIG. 4 is a graphical illustration for explaining Snell's law.

Referring to FIG. 4, Snell's law is defined as:

$$n_1 \sin \theta_1 = n_2 \sin \theta_2.$$

Herein, $n_1$ represents a refractive index of an incidence layer through which light is incident to an interface, $\theta_1$ represents an incidence angle of the light with respect to the vertical line to the interface, $n_2$ represents a refractive index of a refraction layer through which the light proceeds after passing the interface, and $\theta_2$ represents a refraction angle of the light with respect to the vertical line to the interface.

Therefore, in the embodiment of the present invention, the incident light is refracted when the light is incident from air (refractive index=1) to the anti-reflective coating layer 121 (refractive index of $SiN_x$=2.0), and is also refracted when the light is incident from anti-reflective coating layer 121 to the optical bench 120 (refractive index of silicon=3.5). If the anti-reflective coating layer 121 is formed as multiple layers, the incident light will be refracted as many times as there are layers.

The light signals progressing in the inside the optical bench 120 are totally refracted on the second groove B having a total-refraction layer 122, and thus is incident to the photo-absorption layer 112 without loss of light signals. The principle of the total refraction of the second groove B is as follows.

Figure 5:
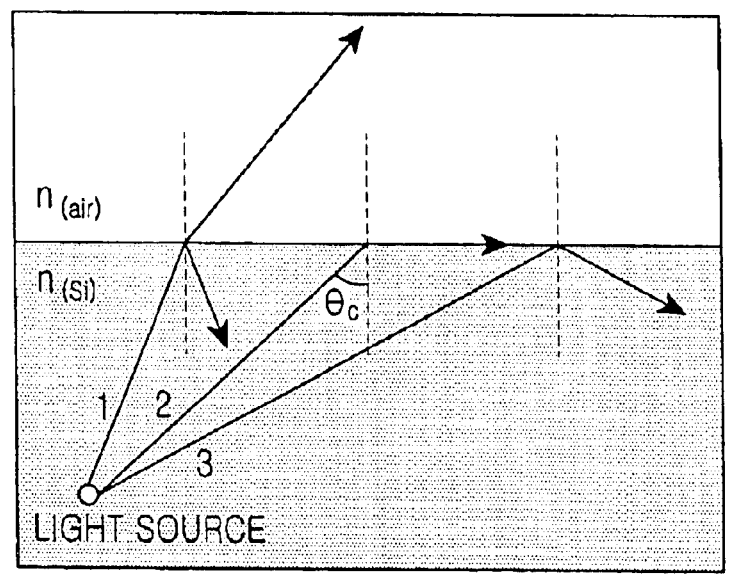
FIG. 5 is a graphical illustration for explaining the principle of total reflection; and, FIG. 6 is a sectional view illustrating the structure of a light receiving element according to another embodiment of the present invention.

Referring to FIG. 5, in a case in which light is incident from a first medium (refractive index of the silicon optical bench=3.5) having a refractive index to a second medium (refractive index of air=1) having a smaller refractive index than that of the first medium, a refraction angle of the light (shown as the first light in FIG. 5) become larger than the incidence angle of the light according to Snell's law. While increasing the incidence angle continuously, when the incidence angle become a critical angle ($\theta_c$) (shown as the second light in FIG. 5) the refraction angle become 90°. Further, when the incidence angle become larger than the critical angle ($\theta_c$) (shown as the third light in FIG. 5), all of light is not refracted but reflected.

Snell's law is applied as follows.

$$n_2 \sin \theta_c = n_1 \sin 90°$$

$$\sin \theta_c = n_1/n_2$$

Therefore, in the embodiment, since $\sin \theta_c = n_{(air)}/n_{(Si)}$, the critical angle ($\theta_c$) is 16.6°. Therefore, when the light incident to the second groove surface B has a larger angle than the critical angle of 16.6° on the basis of a vertical line of the boundary surface, the incident light is not refracted on the second groove surface B but totally reflected.

Accordingly, vertical-incidence angle of light, which is reflected on the second groove and then progresses to the photo-absorption layer 112, deviates slightly from the central axis to 97° to 94°.

Figure 6:
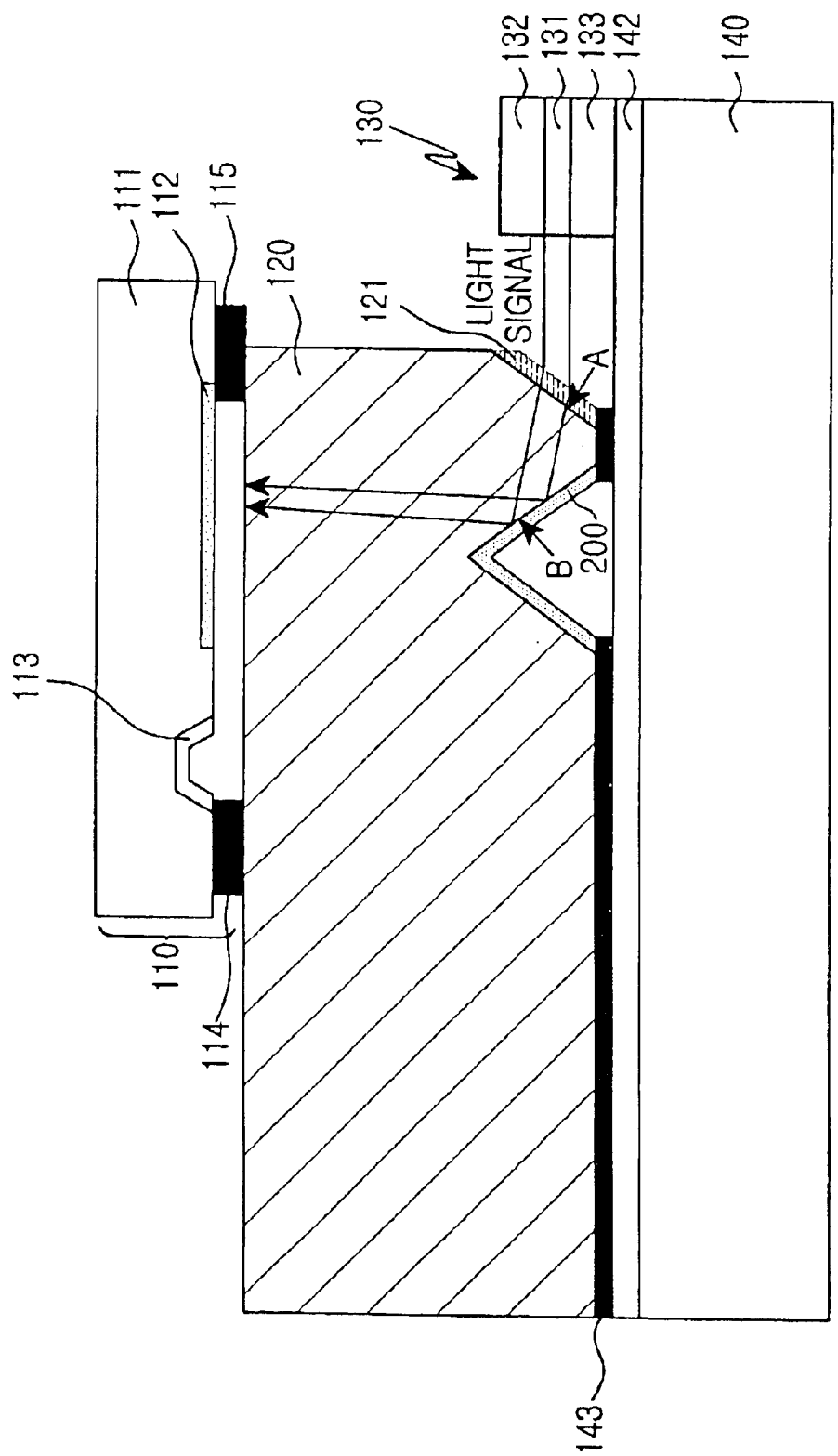

FIG. 6 is a sectional view showing a structure of a light receiving element according to another embodiment of the present invention. The construction and operation of this embodiment are essentially same as that described above with respect to FIG. 3 except that the total reflection layer consists of a metal layer 200. Hence, the discussion of similar components described in the preceding paragraphs is omitted to avoid redundancy, as they are described with respect to FIG. 2.

The metal layer 200 is formed on the second groove B, so that light signals are totally reflected at the metal layer 200. As the metal has a skin depth of about 30 Å to 60 Å depending on the kind of metal and on the wavelengths, the metal layer 200 is formed to have a thickness larger than the skin depth.

Having thus described a preferred embodiment of light receiving element for use in optical communications, it should be apparent to those skilled in the art that certain advantages of the system have been achieved. The foregoing is to be construed as only being an illustrative embodiment of this invention. Persons skilled in the art can easily conceive of alternative arrangements providing a functionality similar to this embodiment without any deviation from the fundamental principles or the scope As described above, the optical apparatus according to the present invention changes path of light signals by refracting and reflecting light signals in using an optical bench having a first and a second groove, so that the optical apparatus can be constructed into a two-dimensional package, while using a vertical light receiving element which cannot be constructed into a two-dimensional package in the prior art. Therefore, in the work for optical coupling, the degree of freedom is reduced from three to two, and thus work errors are reduced. In addition, by changing path of light signals in using silicon optical bench, the final vertical incidence angle of light signals toward the photo-absorption layer of the photo detector can be improved to 97° to 94°, in a case that the slant angle of the V-groove is 55°. Therefore, loss of light can be minimized, and there is an effect in which process margin is greatly improved because the vertical-incidence drift representing deviation degree of light signals according to the thickness of the substrates is very small. Furthermore, according to the present invention, an anti-reflective coating layer can be formed on a groove surface by using a simple PECVD process, so that there is an effect of increasing its process yield.

While the invention has been shown and described with reference to certain preferred embodiments thereof, it will be understood by those skilled in the art that various changes in form and details may be made therein without departing from the spirit and scope of the invention as defined by the appended claims. For example, the technical idea, in which the path of light signals is changed by refracting and reflecting light signals in using an optical bench having a first and a second groove, may be variously applied to receiving elements manufactured in using a group VI, a group II-VI or a group III-V substrate. Therefore, this invention is not to be unduly limited to the embodiment set forth herein, but to be defined by the appended claims and equivalents thereof.

What is claimed is:

1. An optical apparatus having a vertical light receiving element comprising:

a vertical photo detector having a photo-absorption layer; and an optical bench having a first surface and a second surface for mounting the photo detector thereon, and a first groove and a second groove having a 'U' shape or a 'V' shape formed adjacent to each other; the first groove having a predetermined inclination and being opposite to the second surface of the optical bench onto which the photo detector is disposed, wherein a light signal incident to the first groove is refracted at a predetermined angle by the first groove; and the refracted light by the first groove is reflected by the second groove, so that the light signal reflected by the second groove is substantially and vertically incident into the photo-absorption layer.

2. The optical apparatus as claimed in claim 1, wherein the optical bench is made from a semiconductor material and has an inclined profile through a wet-etching process.

3. The optical apparatus as claimed in claim 1, wherein the optical bench is made from one of a group VI, a group II-VI and a group III-V semiconductor substrate.

4. The optical apparatus as claimed in claim 1, wherein the optical bench is a silicon optical bench.

5. The optical apparatus as claimed in claim 1, wherein the vertical photo detector is a top surface illumination-type photo detector.

6. The optical apparatus as claimed in claim 1, wherein the vertical photo detector is a back illumination-type photodiode photo detector.

7. The optical apparatus as claimed in claim 1, wherein the first groove and the second groove are formed so as to have a slant angle of 50° to 60°.

8. The optical apparatus as claimed in claim 1, wherein the first groove further comprises an anti-reflective coating layer so that the light signal is refracted without a reflection when the light signal is incident into the optical bench.

9. The optical apparatus as claimed in claim 8, wherein the anti-reflective coating layer is a deposited film, which is formed by a chemical vapor deposition process or a physical vapor deposition process.

10. The optical apparatus as claimed in claim 1, further comprising a total reflection layer formed on the second groove.

11. The optical apparatus as claimed in claim 10, wherein the reflection layer is a metal layer having thickness substantially larger than the skin depth of the metal layer.

12. The optical apparatus as claimed in claim 11, further comprising a dielectric film formed between the optical bench and the metal layer.

13. An optical apparatus having a vertical light receiving element comprising:

a vertical photo detector having a photo-absorption layer;

an optical bench on which the photo detector is mounted having a first groove having a predetermined inclination and a second groove formed adjacent to each other, the first groove and the second groove having a 'U' shape or a 'V' shape;

a light source;

a substrate for mounting the light source and the optical bench on which the photo detector is mounted, wherein a light signal generated from the light source is refracted by the first groove and then is incident to the inside the optical bench, and the refracted light signal by the first groove, is reflected by the second groove, so that the final reflected light signal is substantially and vertically incident into the photo-absorption layer.

14. The optical apparatus as claimed in claim 13, wherein the light receiving element further comprises an anti-reflective coating layer formed on the first groove so as to minimize loss of the light signal.

15. The optical apparatus as claimed in claim 13, wherein the light receiving element further comprises a total reflection layer formed on the second groove.

16. The optical apparatus as claimed in claim 13, wherein the optical bench is a silicon optical bench.

17. The optical apparatus as claimed in claim 13, wherein the light source is made from a Planar Lightwave Circuit (PLC).

18. The optical apparatus as claimed in claim 13, wherein the substrate is a silicon substrate.

* * * * *